(12) United States Patent
Kim et al.

(10) Patent No.: US 11,282,852 B2
(45) Date of Patent: Mar. 22, 2022

(54) VERTICAL MEMORY DEVICE

(71) Applicant: SAMSUNG ELECTRONICS CO., LTD., Suwon-si (KR)

(72) Inventors: Chang-Bum Kim, Seoul (KR); Sung-Hoon Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 76 days.

(21) Appl. No.: 16/403,316

(22) Filed: May 3, 2019

(65) Prior Publication Data
US 2019/0348436 A1 Nov. 14, 2019

(30) Foreign Application Priority Data

May 9, 2018 (KR) .................. 10-2018-0053203

(51) Int. Cl.
| | |
|---|---|
| *H01L 23/528* | (2006.01) |
| *H01L 27/11582* | (2017.01) |
| *H01L 27/11568* | (2017.01) |
| *H01L 27/11565* | (2017.01) |
| *H01L 27/11573* | (2017.01) |

(52) U.S. Cl.
CPC ...... *H01L 27/11582* (2013.01); *H01L 23/528* (2013.01); *H01L 27/11565* (2013.01); *H01L 27/11568* (2013.01); *H01L 27/11573* (2013.01)

(58) Field of Classification Search
CPC ............. H01L 23/528; H01L 27/11568; H01L 27/11575; H01L 27/11582; H01L 27/11573; H01L 27/11565
USPC .................................................. 257/324
See application file for complete search history.

(56) References Cited

U.S. PATENT DOCUMENTS

| | | | |
|---|---|---|---|
| 8,659,070 B2 | 2/2014 | Tanaka et al. | |
| 9,070,434 B2 | 6/2015 | Hioka et al. | |
| 9,165,823 B2 | 10/2015 | Chen | |
| 9,165,832 B1 | 10/2015 | Chen | |
| 9,466,531 B2 | 10/2016 | Freeman et al. | |
| 9,515,084 B2 | 12/2016 | Oh et al. | |
| 9,620,513 B2 | 4/2017 | Lee et al. | |
| 2014/0015057 A1* | 1/2014 | Lee | H01L 27/11582 257/368 |
| 2017/0179025 A1 | 6/2017 | Yun et al. | |
| 2017/0200676 A1 | 7/2017 | Jeong et al. | |
| 2017/0352680 A1* | 12/2017 | Shin | H01L 27/11573 |

* cited by examiner

*Primary Examiner* — Hrayr A Sayadian
(74) *Attorney, Agent, or Firm* — Volentine, Whitt & Francos, PLLC

(57) ABSTRACT

A vertical memory device includes a gate line structure including a cell region in which a vertical channel structure is formed, and a first connection region and a second connection region which are respectively arranged at first and second ends of the cell region in a first direction. Each of the first connection region and the second connection region includes a first protrusion of the first gate line and a second protrusion of the second gate line which are parallel to a top surface of the substrate and arranged as steps in a second direction perpendicular to the first direction. The first protrusion of the second connection region is arranged diagonally from the first protrusion of the first connection region with respect to a center line of the cell region which is parallel to the first direction.

19 Claims, 12 Drawing Sheets

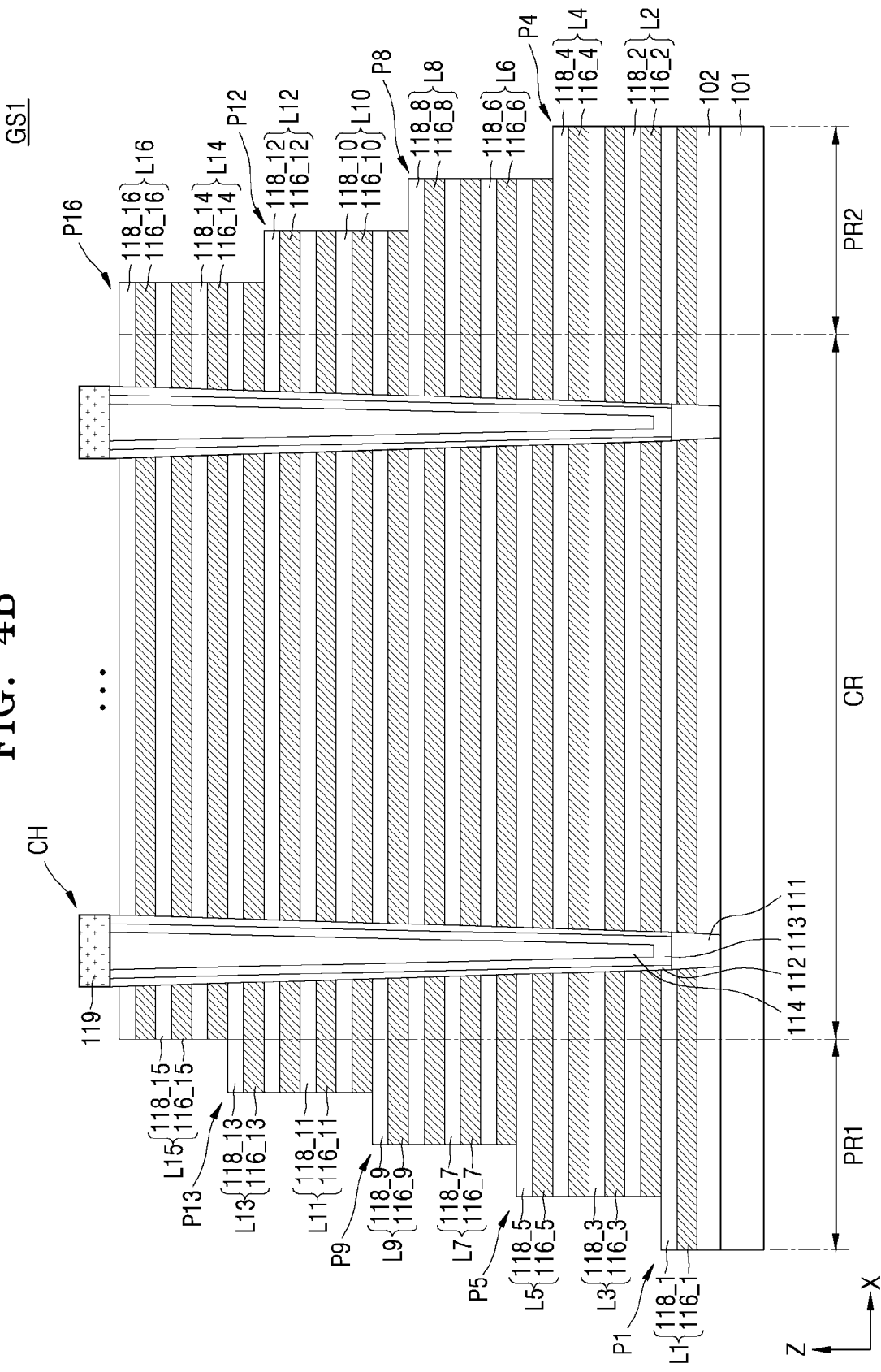

VERTICAL MEMORY DEVICE

CROSS-REFERENCE TO RELATED APPLICATION

A claim for priority under 35 U.S.C. § 119 is made to Korean Patent Application No. 10-2018-0053203, filed on May 9, 2018, in the Korean Intellectual Property Office, the entire contents of which are hereby incorporated by reference.

BACKGROUND

The present inventive concepts herein relate to a vertical memory device, and more particularly to vertical memory devices including gate lines stacked in a vertical direction.

The demand for large capacity, highly integrated circuit devices including memory devices continues to increase. Attention has recently focused on vertical memory devices including memory cells vertically arranged in three dimensions as a way to provide increased integration. Since vertical memory devices have a structure in which each memory cell is stacked in a vertical direction, a pad structure is typically needed to apply electrical signals to each memory cell stacked in the vertical direction.

SUMMARY

Embodiments of inventive concepts provide a vertical memory device including gate lines stacked in a vertical direction.

Embodiments of the inventive concepts provide a vertical memory device including a gate line structure including a first gate line and a second gate line which are sequentially stacked on a substrate and extend in a first direction parallel to a top surface of the substrate; and a vertical channel structure configured to penetrate the gate line structure in a direction perpendicular to the top surface of the substrate. The gate line structure includes a cell region in which the vertical channel structure is formed, and a first connection region and a second connection region which are respectively arranged at first and second ends of the cell region in the first direction. Each of the first connection region and the second connection region includes a first protrusion of the first gate line and a second protrusion of the second gate line which are parallel to the top surface of the substrate and arranged as steps in a second direction perpendicular to the first direction. The first protrusion of the second connection region is arranged diagonally from the first protrusion of the first connection region with respect to a center line of the cell region which is parallel to the first direction.

Embodiments of the inventive concepts further provide a vertical memory device including a gate line structure including a plurality of gate lines which are sequentially stacked on a substrate and extend parallel to a top surface of the substrate in a first direction; and a vertical channel structure configured to penetrate the gate line structure in a direction perpendicular to the top surface of the substrate. The gate line structure includes a cell region in which the vertical channel structure is formed, and a first connection region and a second connection region which are respectively arranged at first and second ends of the cell region along the first direction. Each of the first connection region and the second connection region includes a plurality of protrusions of the plurality of gate lines arranged as steps in the first direction and in a second direction perpendicular to the first direction. Each of the plurality of protrusions of the first connection region is arranged in parallel along the first direction with protrusions from among the plurality of protrusions of the second connection region on different layers of the plurality of gate lines.

Embodiments of the inventive concepts still further provide a vertical memory device including a gate line structure including a plurality of gate lines which are sequentially stacked on a substrate and extend in a first direction parallel to a top surface of the substrate; a vertical channel structure configured to penetrate the gate line structure in a direction perpendicular to the top surface of the substrate; and a plurality of pass transistors electrically connected to the plurality of gate lines. The gate line structure includes a cell region in which the vertical channel structure is formed, and a first connection region and a second connection region which are respectively arranged at first and second ends of the cell region in the first direction. Each of the first connection region and the second connection region includes a plurality of protrusions of the plurality of gate lines arranged as steps in the first direction and in a second direction perpendicular to the first direction. The protrusions from among the plurality of protrusions on a same layer of the plurality of gate lines are arranged to be misaligned relative to each other in the second direction.

BRIEF DESCRIPTION OF THE DRAWINGS

Embodiments of the inventive concepts will be more clearly understood from the following detailed description taken in conjunction with the accompanying drawings in which:

FIG. 4B illustrates a cross-sectional view taken along the line A-A' in FIG. 4A;

DETAILED DESCRIPTION OF THE EMBODIMENTS

Figure 1:
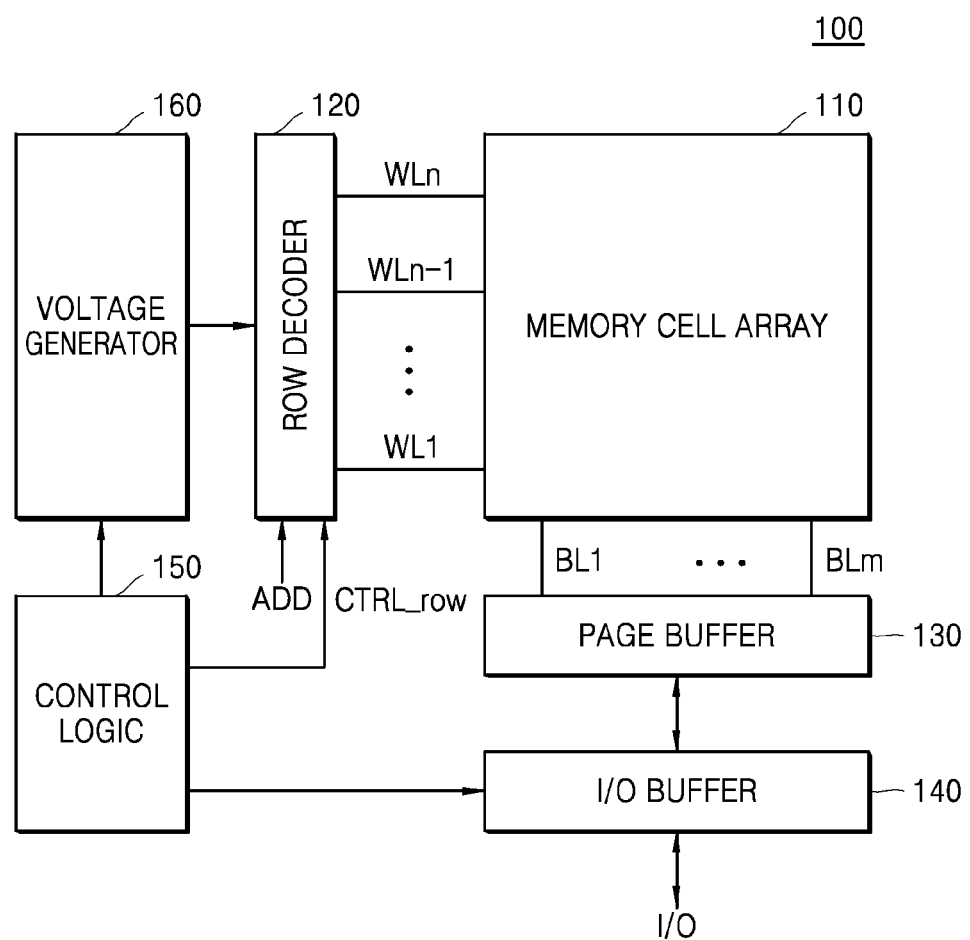
FIG. 1 illustrates a block diagram of a vertical memory device according to an embodiment of the inventive concepts.

Hereinafter, embodiments of the inventive concepts will be described in detail with reference to the accompanying drawings. Identical reference numerals are used for the same constituent elements in the drawings, and a duplicate description thereof will be omitted.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

FIG. 1 illustrates a block diagram of a vertical memory device 100 according to an embodiment of the inventive concepts.

Referring to FIG. 1, the vertical memory device 100 includes a memory cell array 110, a row decoder 120, a page buffer 130, an input/output (I/O) buffer 140, a control logic 150, and a voltage generator 160. According to an embodiment, the vertical memory device 100 may be a volatile memory including for example flash memory devices, magnetoresistive random-access memory (MRAM), resistive RAM (ReRAM), ferroelectric RAM (FRAM), or the like. According to an embodiment, the vertical memory device 100 may be implemented with various memory devices including row decoders that drive row lines including word lines.

The memory cell array 110 is connected to the row decoder 120 via first through $n^{th}$ word lines WL1 through WLn. In addition, the memory cell array 110 is connected to the page buffer 130 via first through $m^{th}$ bit lines BL1 through BLm. The page buffer 130 may operate as a write driver or as a sense amplifier depending on an operation mode. For example, in a program operation, the page buffer 130 may transmit voltages corresponding to data to be programmed to the first through $m^{th}$ bit lines BL1 through BLm. In addition, in a read operation, the page buffer 130 may sense data stored in selected memory cells via the first through $m^{th}$ bit lines BL1 to BLm, and may transmit the sensed data to the I/O buffer 140. The I/O buffer 140 may transmit input data to the page buffer 130 or may output the data provided from the page buffer 130 to the outside. The input data and the output data at the I/O buffer 140 is indicated generally as I/O. A circuit diagram of a plurality of cell blocks included in the memory cell array 110 will be subsequently described with reference to FIG. 3. Also, a configuration of the plurality of cell blocks included in the memory cell array 110 will be subsequently described with reference to FIG. 9.

The control logic 150 may control various components provided in the vertical memory device 100. For example, the control logic 150 may generate internal control signals according to commands such as a program operation command and a read operation command provided from the outside. For example, the control logic 150 may control the voltage generator 160 to generate various levels of voltages used for the program operation and the read operation, and to generate various other voltages. In addition, the control logic 150 may control I/O timings of data by controlling the I/O buffer 140. In addition, according to embodiments of the inventive concepts, the control logic 150 may generate a control signal CTRL_row that controls the row decoder 120. The row decoder 120 may perform a select operation on cell blocks and the first through $n^{th}$ word lines WL1 through WLn of the memory cell array 110 based on the control signal CTRL_row.

The voltage generator 160 may generate various types of word line voltages to be supplied to each of the first through $n^{th}$ word lines WL1 through WLn based on the control of the control logic 150, and a bulk voltage to be supplied to a bulk (for example, a well region) formed by the memory cells. For example, during a program operation, the voltage generator 160 may generate a program voltage provided to a selected word line and a pass voltage provided to an unselected word line. In addition, during a read operation, the voltage generator 160 may generate a selected word line voltage and an unselected word line voltage which have different levels from each other. Also, the voltage generator 160 may provide a high erase voltage to the bulk in which the memory cell array 110 selected in the erase operation is formed.

The memory cell array 110 may include a plurality of cell blocks. In FIG. 1, one memory cell array 110 and one row decoder 120 are illustrated, but this is only for illustrative convenience. In some embodiments of the inventive concept, one row decoder 120 may be arranged per cell block of memory cell array 110. Alternatively, in other embodiments, one row decoder 120 may be shared by at least two cell blocks of memory cell array 110. In such a case, the number of row decoders 120 of the vertical memory device 100 may be less than the number of cell blocks.

The row decoder 120 may perform an operation related to selection of a corresponding cell block according to a received address ADD from a host for example. For example, the row decoder 120 may provide the word line voltages to the first through $n^{th}$ word lines WL1 through WLn of a selected cell block, and may block providing of the word line voltages to the first through $n^{th}$ word lines WL1 through WLn of an unselected cell block. A configuration of the row decoder 120 will be subsequently described with reference to FIG. 2.

The vertical memory device 100 according to an embodiment of the inventive concepts may include a flash memory device, and the memory cell array 110 may include a plurality of negative-AND (NAND) cell strings. Each cell string may include a channel in a vertical direction. The vertical memory device 100 may include a gate line structure in which a plurality of gate lines are stacked, and the cell strings may be formed to penetrate the gate line structure in the vertical direction. One cell block may be formed in one gate line structure. The memory cells formed in each of the cell strings may be programmed or erased by a high voltage supplied from the row decoder 120.

In addition, the memory cell array 110 may be connected to the row decoder 120 via other lines in addition to the first through $n^{th}$ word lines WL1 through WLn. For example, the memory cell array 110 may be connected to the row decoder 120 via one or more string selection lines SSL and a ground selection line GSL. In this case, the string selection line SSL, the first through $n^{th}$ word lines WL1 through WLn, and the ground selection line GSL may be referred to as row lines. In addition, voltages provided in the row lines may be referred to as row line voltages.

Figure 2:
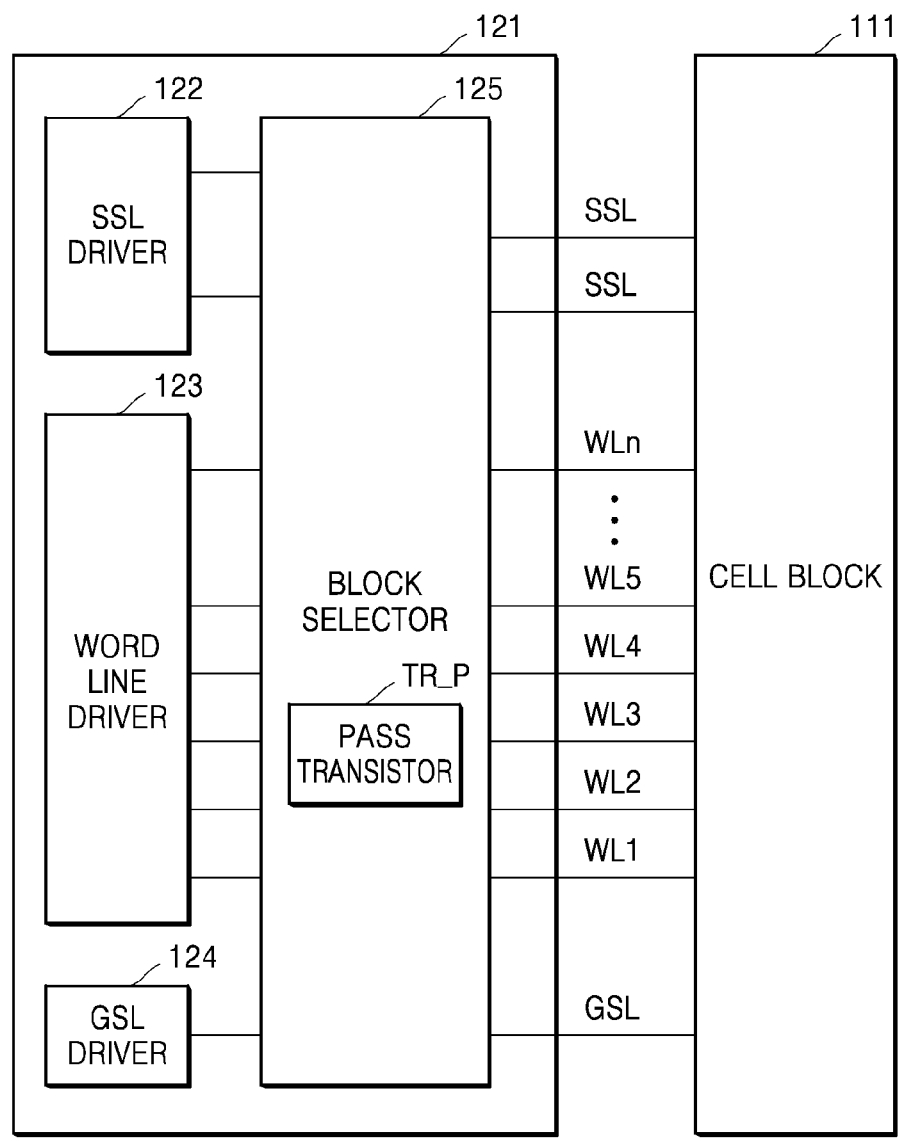
FIG. 2 illustrates a block diagram of an example implementation of a row decoder in FIG. 1.

FIG. 2 illustrates a block diagram of an example implementation of the row decoder 120 in FIG. 1. FIG. 2 illustrates an example in which the vertical memory device 100 of FIG. 1 is a flash memory device and a row decoder 121 drives flash memory cells. A cell block 111 illustrated in FIG. 2 may be any one of the plurality of cell blocks included in the memory cell array 110 in FIG. 1. The row decoder 121 may correspond to a portion of a configuration of the row decoder 120 in FIG. 1. In addition, even though two string selection lines SSL and one ground selection line GSL are illustrated in FIG. 2, according to other embodiments of the inventive concepts, various numbers of string selection lines SSL and ground selection lines GSL may be arranged.

Referring to FIG. 2, the row decoder 121 includes a string selection line (SSL) driver 122, a word line driver 123, a ground selection line (GSL) driver 124, and a block selector 125. The block selector 125 may decode at least some bits of a received address ADD (see FIG. 1) and select the cell block 111 from among a plurality of corresponding cell blocks. In an embodiment, the block selector 125 may be arranged between the SSL driver 122, the word line driver 123, the GSL driver 124, and the plurality of cell blocks.

The SSL driver 122 is connected to the string selection line(s) SSL via the block selector 125 and may drive the string selection line(s) SSL via the block selector 125. For example, during an erase operation the SSL driver 122 may float the string selection line(s) SSL, and during a program operation the SSL driver 122 may supply a high string selection voltage (for example, a power voltage) via the string selection line(s) SSL.

The word line driver 123 is connected to the first through nth word lines WL1 through WLn via the block selector 125 and may drive the first through nth word lines WL1 through WLn via the block selector 125. For example, during an erase operation a high erase voltage may be applied to the bulk in which the cell block 111 is formed, and the word line driver 123 may apply a relatively low level word line voltage (for example, a ground voltage) to the first through nth word lines WL1 through WLn. In addition, during a program operation the word line driver 123 may provide a program voltage having a high level to the selected word line and a pass voltage to the unselected word line.

The GSL driver 124 may drive the ground selection line GSL via the block selector 125. For example, during an erase operation the GSL driver 124 may float the ground selection line GSL, and during a program operation the GSL driver 124 may supply a low level ground select voltage (for example, the ground voltage) to the ground selection line GSL.

The block selector 125 may include a plurality of pass transistors TR_P connected between the SSL driver 122, the word line driver 123, the GSL driver 124, and the row lines (the string selection line(s) SSL, the first through nth word lines WL1 through WLn, and the ground selection line GSL). The row line voltage applied to the row lines (the string selection line(s) SSL, the first through nth word lines WL1 through WLn, the ground selection line GSL) may be controlled based on a switching operation of the plurality of pass transistors TR_P. For example, the vertical memory device 100 may include a gate line structure in which a plurality of gate lines are stacked, and each of the plurality of pass transistors TR_P may switch the row line voltages applied to a plurality of gate lines that constitute one cell block.

In an embodiment of the inventive concepts, one pass transistor TR_P may be electrically connected to one gate line included in one gate line structure corresponding to one cell block. A connection relationship between the gate line and the pass transistor TR_P will be subsequently described with reference to FIG. 4A.

Alternatively, in some embodiments the cell block 111 may include a first sub-cell block and a second sub-cell block. One pass transistor TR_P may be electrically connected to one gate line included in one bus-gate line structure corresponding to one sub-cell block. However, embodiments of the inventive concepts are not limited thereto, and in other embodiments one pass transistor TR_P may be electrically connected to the plurality of gate lines included in one sub-gate line structure corresponding to one sub-cell block.

Figure 3:
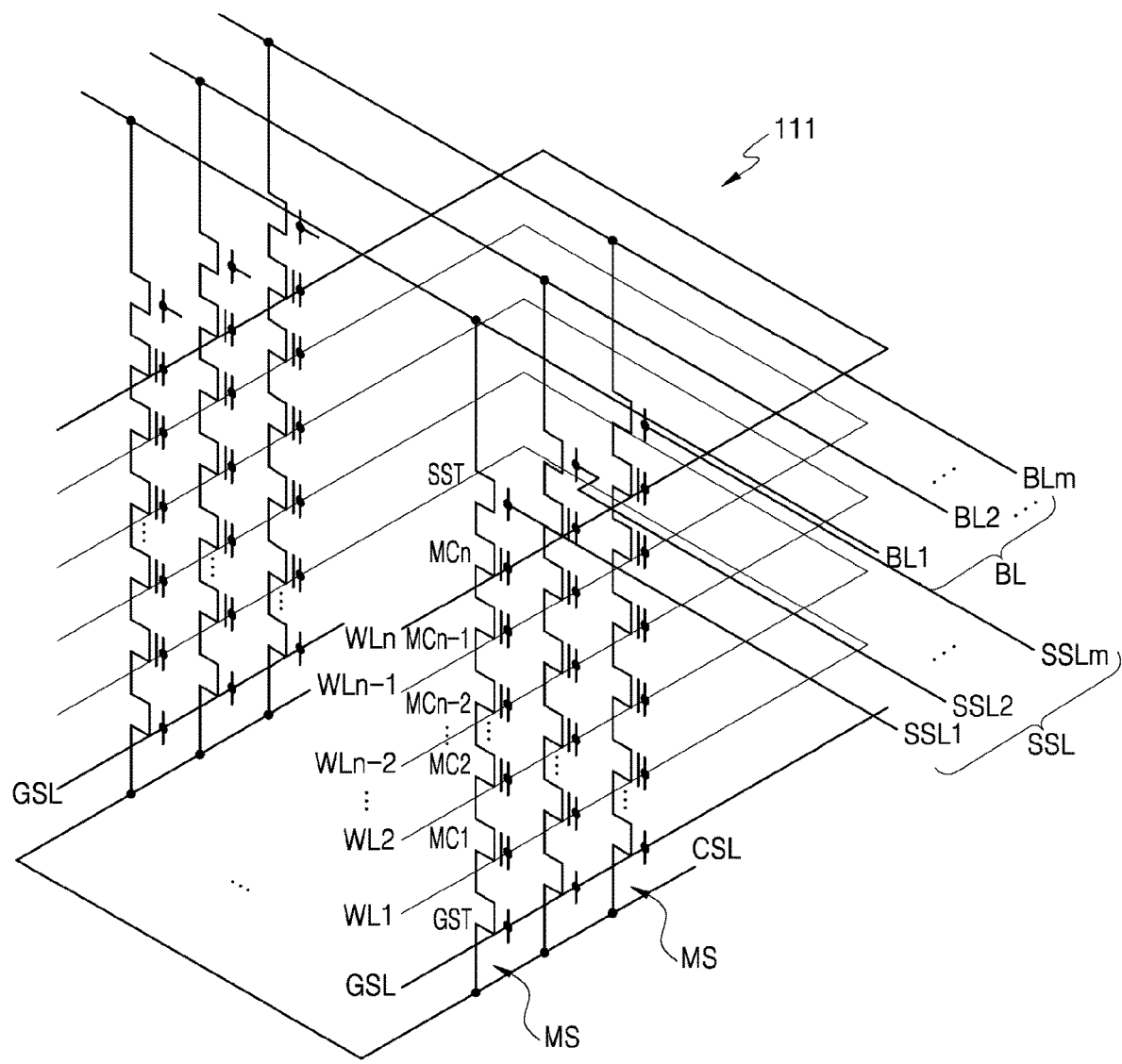
FIG. 3 illustrates an equivalent circuit diagram of a cell block included in a memory cell region of a vertical memory device according to an embodiment of the inventive concepts.

FIG. 3 illustrates an equivalent circuit diagram of the cell block 111 included in a memory cell region of the vertical memory device 100 according to an embodiment of the inventive concepts. FIG. 3 illustrates an equivalent circuit diagram of a vertical NAND flash memory device having a vertical channel structure.

Referring to FIG. 3, the cell block 111 included in the memory cell array 110 includes a plurality of memory cell strings MS. The cell block 111 may include the first through $m^{th}$ bit lines BL1, BL2 through BLm (also indicated collectively as BL), the first through $n^{th}$ word lines WL1, WL2 through WLn-2, WLn-1 and WLn, first through $m^{th}$ string selection lines SSL1, SSL2 through SSLm (also indicated collectively as SSL), at least one ground selection line GSL, and a common source line CSL. The plurality of memory cell strings MS may be formed between the first through $m^{th}$ bit lines BL1 through BLm (BL) and the common source line CSL.

Each of the plurality of memory cell strings MS may include a string selection transistor SST, a ground selection transistor GST, and first through $n^{th}$ memory cell transistors MC1, MC2, through MCn-2, MCn-1 and MCn. A drain region of the string selection transistor SST may be connected to a corresponding one of the bit lines BL, and a source region of the ground selection transistor GST may be connected to the common source line CSL. The common source line CSL may be a region in which the source regions of the plurality of ground selection transistors GST are connected to each other in common.

The string selection transistors SST respectively included in the plurality of memory cell strings MS may be connected to different string selection lines from each other, so that each of the plurality of memory cell strings MS is independently controlled. For example, the string selection transistor SST may be connected to one string selection line (for example, one of the first, second, and third string selection lines SSL1, SSL2, and SSL3).

The ground selection transistor GST may be connected to the ground selection line GSL. In an embodiment, the different ground selection transistors GST included in the plurality of memory cell strings MS of the cell block 111 may be connected to the same ground selection line GSL. However, embodiments of the inventive concepts are not limited thereto, and the different ground selection transistors GST may be connected to different ground selection lines GSL.

The first through n[th] memory cell transistors MC1 through MCn may be connected to the plurality of word lines WL, respectively.

The first through n[th] memory cell transistors MC1 through MCn constituting the memory cell string MS in the cell block 111 may have a structure connected in series on a main surface of a substrate in the vertical direction. In the cell block 111, at least one string selection line SSL, at least one ground selection line GSL, and the plurality of word lines WL may extend in a horizontal direction parallel to the main surface of the substrate, and may be arranged to overlap each other in the vertical direction perpendicular to the main surface of the substrate.

Figure 4A:
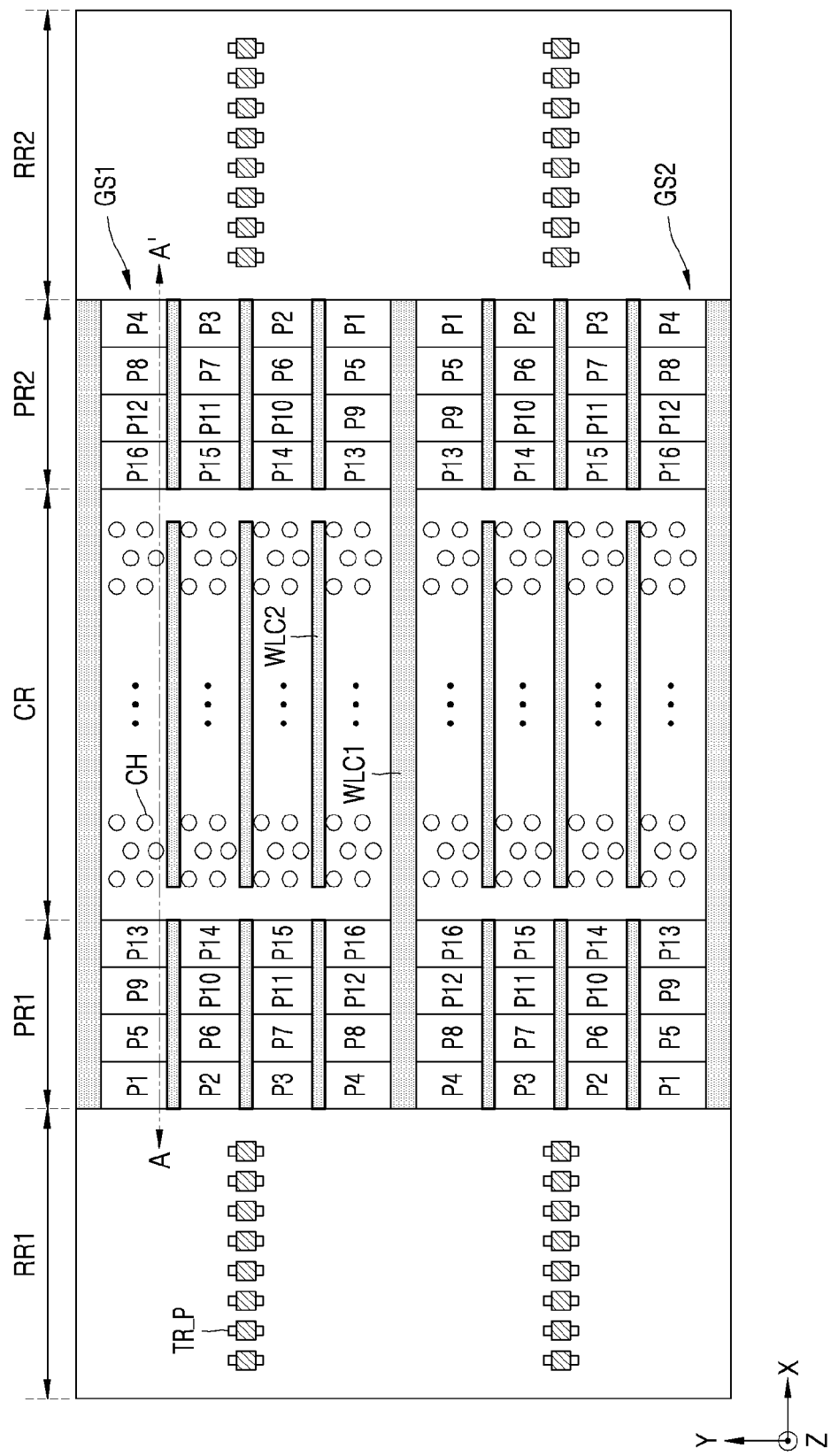
FIG. 4A illustrates a top view of a vertical memory device according to an embodiment of the inventive concepts.
Figure 4C:
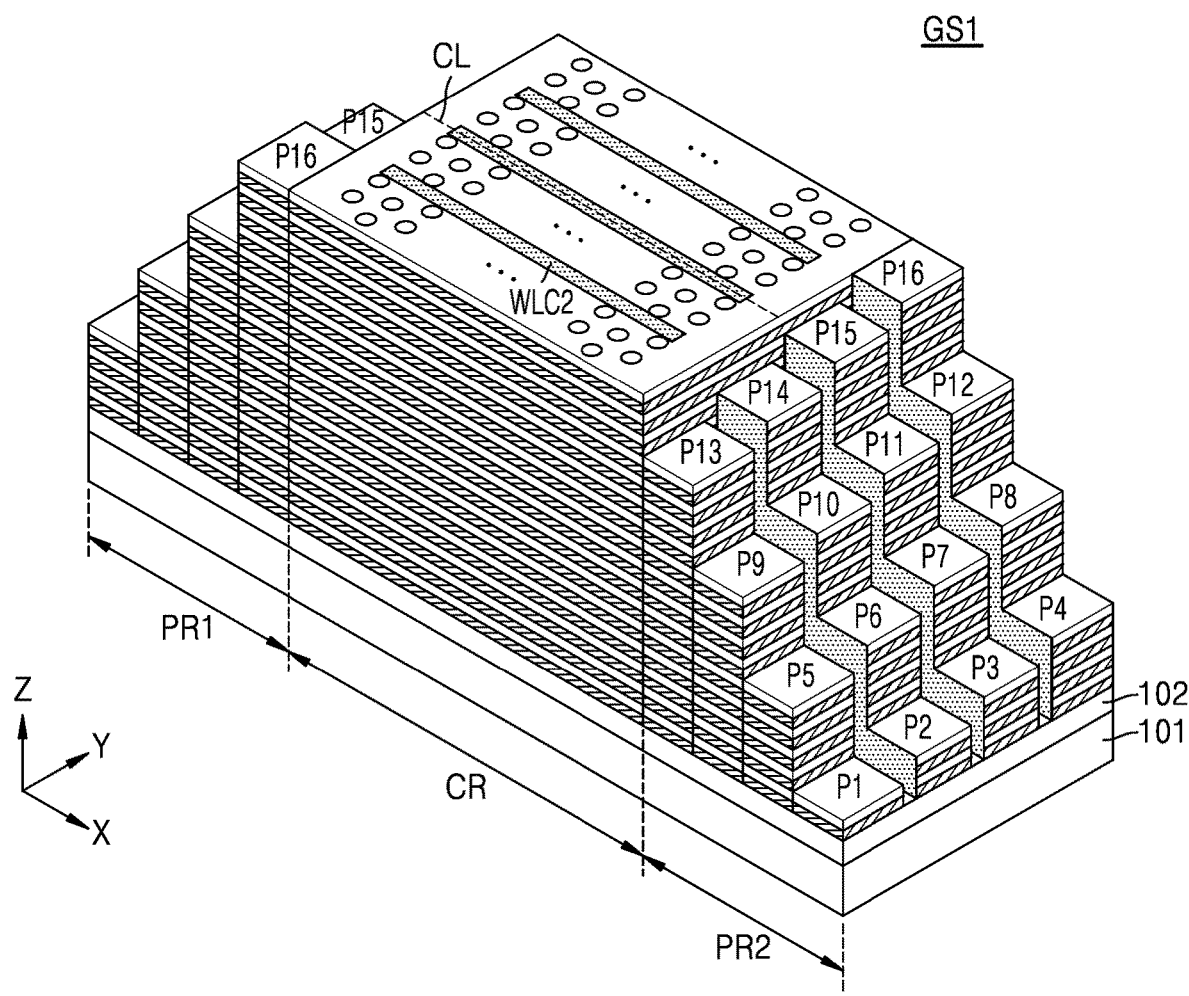
FIG. 4C illustrates a perspective view of a first gate line structure illustrated in FIG. 4A.

FIG. 4A illustrates a top view of a vertical memory device 100a according to an embodiment of the inventive concepts. FIG. 4B illustrates a cross-sectional view taken along the line A-A' in FIG. 4A. FIG. 4C illustrates a perspective view of a first gate line structure GS1 illustrated in FIG. 4A. FIG. 4B illustrates a cross section of the first gate line structure GS1, a description of which may also be applied to a second gate line structure GS2. In addition, even though FIG. 4C shows only the first gate line structure GS1, the description of the first gate line structure GS1 may also be applied to the second gate line structure GS2.

Referring to FIGS. 4A and 4B, the vertical memory device 100a may be implemented in a semiconductor chip, and includes a memory cell region CR, and a first connection region PR1 and a second connection region PR2, which are arranged at both ends (e.g., first and second ends) of the memory cell region CR. The memory cell region CR is located in a center position between the first and second connection regions PR1 and PR2 along a first direction (X). In addition, the vertical memory device 100a includes a first row decoder region RR1 and a second row decoder region RR2. The first row decoder region RR1 is arranged adjacent to the first connection region PR1 in a direction opposite to the first direction (X), and the second row decoder region RR2 is arranged adjacent to the second connection region PR2 in the first direction (X).

The vertical memory device 100a includes the first gate line structure GS1 and the second gate line structure GS2. Even though the vertical memory device 100a is illustrated as including two gate line structures in FIG. 4A, the illustration is only for convenience of explanation. In other embodiments the vertical memory device 100a may include more than three gate line structures, and the inventive concepts are not limited with respect to the number of gate line structures.

The vertical memory device 100a includes a plurality of word line cut regions. The plurality of word line cut regions may include a first word line cut region WLC1 and a second word line cut region WLC2.

The first word line cut region WLC1 extends in the first direction (X) parallel to a top surface of a substrate 101. The first word line cut region WLC1 may limit widths of first through sixteenth gate lines 116_1 through 116_16 in a second direction (Y), which is perpendicular to the first direction (X) and parallel to the top surface of the substrate 101. Accordingly, the first through sixteenth gate lines 116_1 through 116_16 may be repeatedly spaced from each other at regular intervals by a plurality of first word line cut regions WLC1, and the first gate line structure GS1 and the second gate line structure GS2 may be separated by the first word line cut region WLC1. The first gate line structure GS1 and the second gate line structure GS2, which are separated by the first word line cut region WLC1, may respectively correspond to one cell block. For example, the first gate line structure GS1 may constitute a first cell block, and the second gate line structure GS2 may constitute a second cell block.

The second word line cut region WLC2 is formed inside one cell block. Thus, the second word line cut region WLC2 extends in the first direction (X) parallel to the top surface of the substrate 101, but unlike the first word line cut region WLC1, the second word line cut region WLC2 may include some disconnected areas.

Each of the first gate line structure GS1 and the second gate line structure GS2 includes the first through sixteenth gate lines 116_1 through 116_16 that are sequentially stacked from the top surface of the substrate 101 in a third direction (Z).

The substrate 101 may include a semiconductor material such as for example silicon and germanium, or the like. In an embodiment, the substrate 101 may include mono-crystalline silicon. An insulating layer 102 may be arranged on the substrate 101.

The first through sixteenth gate lines 116_1 through 116_16 may include a metal such as for example tungsten, nickel, cobalt, and tantalum or the like, a metal silicide such as for example tungsten silicide, nickel silicide, cobalt silicide, and tantalum silicide or the like, polysilicon doped with impurities, or a combination thereof. Each of the first through sixteenth gate lines 116_1 through 116_16 may be referred to as a word line WL, a string selection line SSL, or a ground selection line GSL. For example, the first gate line 116_1 on a bottom level may be provided as a ground selection line GSL, and the sixteenth gate line 116_16 on a top level may be provided as a string selection line SSL. The second through fifteenth gate lines 116_2 through 116_15 between the ground selection line GSL and the string selection line SSL may be provided as word lines WL.

First through sixteenth gate insulating layers 118_1 through 118_16 are arranged under or on the first through sixteenth gate lines 116_1 through 116_16, respectively. For example, the first gate insulating layer 118_1 is arranged under the second gate line 116_2 and on (over) the first gate line 116_1. The first through sixteenth gate insulating layers 118_1 to 118_16 may include for example silicon oxide, silicon nitride, or silicon oxynitride, or the like.

The first gate line structure GS1 and the second gate line structure GS2 include the memory cell region CR in which vertical channel structures CH are formed. The vertical channel structure CH are formed by penetrating the first gate line structure GS1 or the second gate line structure GS2 in the third direction (Z) perpendicular to the top surface of the substrate 101. The plurality of memory cells MC are formed in the memory cell region CR, and may have a circuit structure described with reference to the first through n[th] memory cell transistors MC1 through MCn in FIG. 3.

The vertical channel structure CH includes a gate dielectric layer 112, a channel region 113, a buried insulating layer 114, and a drain region 119. In some embodiments, a barrier metal film may be formed between the gate dielectric layer 112 and the first through sixteenth gate lines 116_1 through 116_16.

The channel region 113 may include doped polysilicon and/or undoped polysilicon. The channel region 113 may for example have a cylindrical shape. An inner space of the channel region 113 may be filled with the buried insulating layer 114.

The gate dielectric layer 112 may include a tunnel insulating layer, a charge storage layer, and a blocking dielectric layer. The tunnel insulating layer, the charge storage layer, and the blocking dielectric layer may be sequentially stacked on an outer wall of the channel region 113 and may be formed to surround the outer wall of the channel region 113. The tunnel insulating layer may include an oxide such as silicon oxide for example. The charge storage layer may include silicon nitride for example. The blocking dielectric layer may include for example silicon oxide, or a metal oxide such as hafnium oxide or aluminum oxide.

The buried insulating layer 114 may include an insulating material. For example, the buried insulating layer 114 may include silicon oxide, silicon nitride, silicon oxynitride, or a combination thereof. In some embodiments, the buried insulating layer 114 may be omitted, in which case the channel region 113 may have a pillar structure without an internal space thereof.

The drain region 119 may include a polysilicon layer doped with impurities.

Each of the first gate line structure GS1 and the second gate line structure GS2 include the first connection region PR1 and the second connection region PR2 which are respectively arranged at both ends of the memory cell region CR. The memory cell region CR is located in a center position between the first and second connection regions PR1 and PR2 along the first direction (X). First through sixteenth protrusions P1 through P16 of the first gate line structure GS1 and the second gate line structure GS2 formed as or providing pad structures are arranged in the first connection region PR1 and the second connection region PR2. A protrusion should be understood as an area of a layer (e.g., layers L1 through L16) that extends (i.e., protrudes) beyond corresponding layers disposed above the layer. In other words, a protrusion is an area of a layer that does not have another corresponding layer or layers (e.g., from among layers L1 through L16) thereon. The plurality of pass transistors TR_P may be connected to the first through sixteenth gate lines 116_1 through 116_16 of each of the first gate line structure GS1 and the second gate line structure GS2 via the pad structures of the first connection region PR1 and the second connection region PR2. The shapes of the first through sixteenth protrusions P1 through P16 of the first connection region PR1 and the second connection region PR2 will be subsequently described with reference to FIG. 4C.

In an embodiment of the inventive concepts, each of the first through sixteenth gate lines 116_1 through 116_16 included in the first gate line structure GS1 may be connected to one pass transistor TR_P, and each of the first through sixteenth gate lines 116_1 through 116_16 included in the second gate line structure GS2 may be connected to one pass transistor TR_P.

Referring to FIGS. 3, 4A, and 4B, a value of n in FIG. 3 may be 16, and the first through sixteenth word lines WL1 through WL16 may be connected to the first through sixteenth gate lines 116_1 through 116_16 in FIGS. 4A, 4B, and 4C. For example, the first word line WL1 may be connected to the first gate line 116_1, and the second word line WL2 may be connected to the second gate line 116_2. In FIGS. 4A and 4B, the first through sixteenth gate lines 116_1 through 116_16 are illustrated to include a total of 16 layers, but the inventive concepts are not limited thereto. In other words, in other embodiments the value of n in FIG. 3 may be less or greater than 16. The number of first through sixteenth gate lines 116_1 through 116_16 may vary depending on the structure of the cell strings included in the memory cell array 110. The vertical memory device 100 according to embodiments of the inventive concepts is not limited to the number (e.g., 16) of first through sixteenth gate lines 116_1 through 116_16.

More gate lines may be further formed on or over the first through sixteenth gate lines 116_1 through 116_16 and may be connected to the string selection line SSL. Here, in the embodiment shown in FIGS. 4A and 4B, the number of string selection lines SSL connected to one block (for example, the first gate line structure GS1 or the second gate line structure GS2) is 4, but is not limited thereto, and in other embodiments the number of string selection lines may be greater or less than 4 based on the number of second word line cut regions WLC2.

Referring to FIGS. 4A through 4C, the first gate line 116_1 and the first gate insulating layer 118_1 form one first layer L1, and the second gate line 116_2 and the second gate insulating layer 118_2 form one second layer L2. The third through sixteenth gate lines 116_3 through 116_16, and the third through sixteenth gate insulating layers 118_3 through 118_16 respectively corresponding thereto form third through sixteenth layers L3 through L16. Each of exposed portions of the first through sixteenth layers L1 through L16 constitute the first through sixteenth protrusions P1 through P16.

Each of the first through sixteenth gate lines 116_1 through 116_16 respectively includes the first through sixteenth protrusions P1 through P16 for forming or providing the pad structures. Here, each of the first through sixteenth gate lines 116_1 through 116_16 may include one protrusion in the first connection region PR1 and one protrusion in the second connection region PR2. For example, the first gate line 116_1 may include a first protrusion P1 arranged in the first connection region PR1 and a first protrusion P1 arranged in the second connection region PR2. The second gate line 116_2 may include a second protrusion P2 arranged in the first connection region PR1 and a second protrusion P2 arranged in the second connection region PR2. Descriptions of the first protrusion P1 of the first gate line 116_1 and the second protrusion P2 of the second gate line 116_2 may be identically applied to the third through sixteenth protrusions P3 through P16 of the third through sixteenth gate lines 116_3 through 116_16.

The first through sixteenth protrusions P1 through P16 of the first connection region PR1 have stepped shape (i.e., arrangement) in the first direction (X) and the second direction (Y). In other words, the protrusions P1 through P16 are arranged as steps in the first direction (X) and in the second direction (Y) perpendicular to the first direction (X). For example, as shown in FIG. 4C, the protrusions P13, P9, P5 and P1 arranged sequentially in the first direction (X) are disposed as stepped with respect to each other, whereby protrusion P13 is disposed at a layer relatively higher than (i.e., above) protrusion P9, protrusion P9 is disposed at a layer relatively higher than protrusion P5, and protrusion P5 is disposed at a layer relatively higher than protrusion P1. For example, as also shown in FIG. 4C, the protrusions P13, P14, P15 and P16 arranged sequentially in the second direction (Y) are disposed as stepped with respect to each other, whereby protrusion P13 is disposed at a layer relatively lower than (i.e., below) protrusion P14, protrusion P14 is disposed at a layer relatively lower than protrusion P15, and protrusion P15 is disposed at a layer relatively lower than protrusion P16. In addition, the first through sixteenth protrusions P1 through P16 of the second connection region PR2 have stepped shape (i.e., arrangement) in the first direction (X) and the second direction (Y). In FIGS. 4A and 4B, four protrusions are arranged in the first direction (X) and four protrusions are arranged in the second direction (Y) in each of the first connection region PR1 and the second connection region PR2. However, the vertical memory device 100a according to the inventive concepts is not limited as shown in FIGS. 4A and 4B, and in other embodiments the first through the sixteenth protrusions P1 through P16 in each of the first connection region PR1 and the second connection region PR2 may be arranged in various ways.

The protrusions included in the same layer, among the first through sixteenth protrusions P1 through P16 included in each of the first through sixteenth gate lines 116_1 through 116_16, are arranged diagonally with respect to each other with reference to the first direction (X). In other words, the protrusions arranged on the same layer are not arranged in parallel with each other in the first direction (X), or in other words are not co-linear with each other in the first direction (X), but are misaligned relative to each other in the second direction (Y). For example, as shown in the top view of FIG. 4A, the first protrusion P1 of the first connection region PR1 is positioned at the leftmost border of the first connection region PR1 and as the fourth protrusion from the first word line cut region WLC1 in the second direction (Y). On the other hand, the first protrusion P1 of the second connection region PR2 is positioned at the rightmost border of the second connection region PR2 and as the first protrusion from the first word line cut region WLC1 in the second direction (Y). The first protrusions P1 of the first and second connection regions PR1 and PR2 within the first gate line structure GS1 are thus positioned diagonally from each other with respect to a center line CL of the memory cell region (i.e., cell region) which is parallel to the first direction (X) as shown in FIG. 4C. In other words, the first protrusion P1 of the first connection region PR1 for example is formed or arranged to be parallel in the first direction (X) with a protrusion (or protrusions) in the second connection PR2 that is (are) formed on (different) layer(s) from among layers L1 through L16 other than the first layer L1. The protrusions P2 through P16 in the first connection region PR1 are respectively positioned diagonally with respect to protrusions P2 and P16 in the second connection region PR2.

Accordingly, each of the first through sixteenth protrusions P1 through P16 of the first connection region PR1 may be arranged in the first direction (X) side by side with the protrusions formed on different layers among the first through sixteenth protrusions P1 through P16 of the second connection region PR2. For example, the first protrusion P1, the fifth protrusion P5, the ninth protrusion P9 and the thirteenth protrusion P13 of the first connection region PR1 may be arranged in the first direction (X) side by side with the sixteenth protrusion P16, the twelfth protrusion P12, the eighth protrusion P8 and the fourth protrusion P4 of the second connection region PR2.

In an embodiment of the inventive concepts, the protrusions arranged on the same layer, among the first through sixteenth protrusions P1 through P16 included in each of the first through sixteenth gate lines 116_1 through 116_16, are arranged in directions opposite to each other with reference to the center line CL which is parallel to the first direction (X) and passes through a center of a width of the first gate line structure GS1 in the second direction (Y). In other words, among the protrusions arranged on the same layer, one protrusion may be arranged in the second direction (Y) with reference to the center line CL, and the other protrusion may be arranged in a direction opposite to the second direction (Y). For example, as shown in FIG. 4C, the sixteenth protrusion P16 of the first connection region PR1 is positioned on a first side of the center line CL, while the sixteenth protrusion P16 of the second connection region PR2 is positioned on a second side of the center line CL opposite the first side.

In an embodiment of the inventive concepts, the first through sixteenth protrusions P1 through P16 of the first connection region PR1 are arranged along the second direction (Y) to be at sequentially lower respective layers, and the first through sixteenth protrusions P1 through P16 of the second connection region PR2 are arranged along the second direction (Y) to be at sequentially higher respective layers. For example, one of the protrusions from among the first through sixteenth protrusions P1 through P16 included in the first connection region PR1 and which is in contact with the first word line cut region WLC1 may be arranged to be higher (e.g., from the substrate 101) than other protrusions sequentially arranged in the second direction (Y). Also, one of the protrusions from among the first through sixteenth protrusions P1 through P16 included in the second connection region PR2 and which is in contact with the first word line cut region WLC1 may be arranged to be lower (e.g., from the substrate 101) than other protrusions sequentially arranged in the second direction (Y).

In an embodiment, the first through sixteenth protrusions P1 through P16 of the first connection region PR1 are symmetrically arranged with respect to the first through sixteenth protrusions P1 through P16 of the second connection region PR2 with reference to the center line CL (or a center point) of the memory cell region CR. For example, in FIG. 4C, the protrusions P1, P2, P3 and P4 in the second connection region PR2 are arranged sequentially from the first word line cut region WLC1 along the second direction (Y), while in the first connection region PR1 the protrusions P4, P3, P2 and P1 are arranged sequentially from the first word line cut region WLC1 along the second direction.

The pad structures for providing electrical connection to the pass transistors TR_P are formed on the first through sixteenth protrusions P1 through P16 of each of the first connection region PR1 and the second connection region PR2. The pad structures are formed as portions of the first through sixteenth gate lines 116_1 through 116_16 exposed to the outside by removing a portion of each of the first through sixteenth gate insulating layers 118_1 through 118_16 from the respective first through sixteenth protrusions P1 through P16.

The vertical memory device 100a according to embodiments of the inventive concepts may include the plurality of pass transistors TR_P arranged at both sides thereof to be adjacent to each of the first connection region PR1 and the second connection region PR2, by forming the first through sixteenth protrusions P1 through P16 capable of forming the pad structures at both ends of the memory cell region CR. Thus, it may be easy to form conductive lines for connecting the plurality of pass transistors TR_P to the first through sixteenth gate lines 116_1 through 116_16, and areas of the first connection region PR1 and the second connection region PR2 may be reduced.

Figure 5:
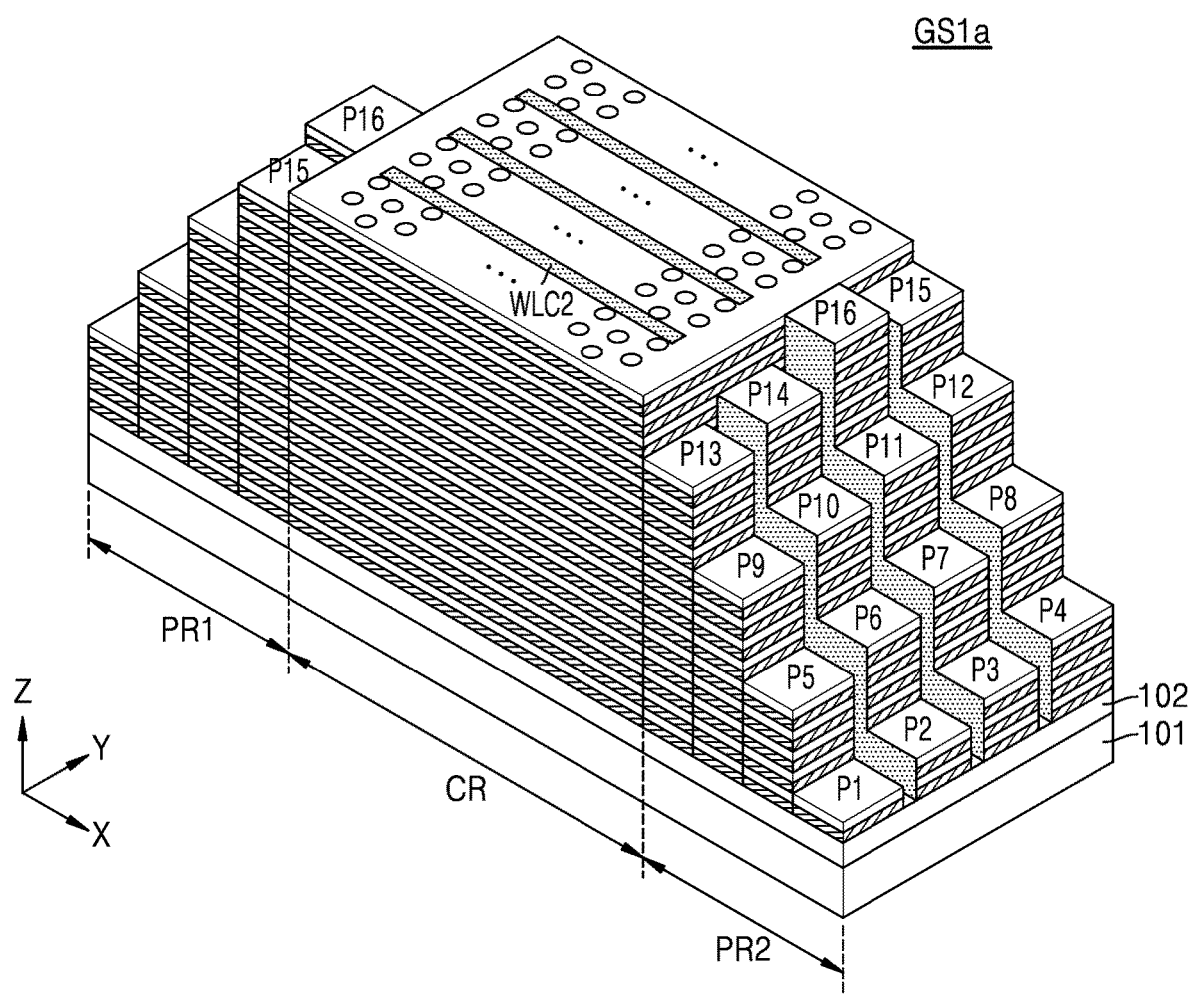
FIG. 5 illustrates a perspective view of a gate line structure included in a vertical memory device according to an embodiment of the inventive concepts.
Figure 6:
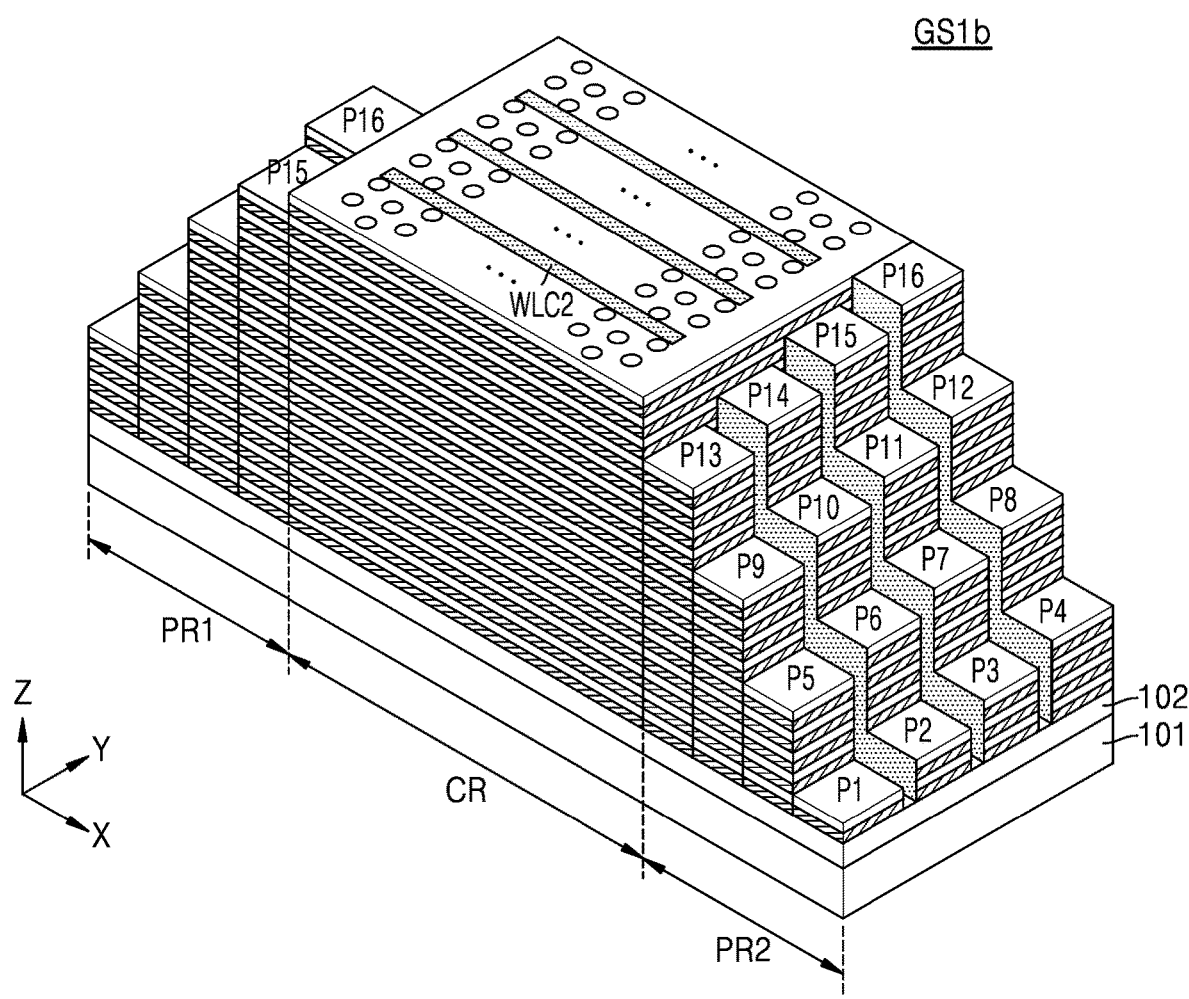
FIG. 6 illustrates a perspective view of a gate line structure included in a vertical memory device according to another embodiment of the inventive concepts.

FIG. 5 illustrates a perspective view of a gate line structures GS1a included in the vertical memory device 100a according to an embodiment of the inventive concepts. FIG. 6 illustrates a perspective view of a gate line structures GS1b included in the vertical memory device 100a according to another embodiment of the inventive concepts. Description of the same reference numerals in FIGS. 5 and 6 as those in FIGS. 4A through 4C may be omitted from the following.

Referring to FIG. 5, the gate line structure GS1a included in the vertical memory device 100a according to the illustrated embodiment, as compared with the first gate line structure GS1 in FIG. 4A, includes at least one protrusion (for example, at least one of the fourth protrusion P4, the eighth protrusion P8, the twelfth protrusion P12, and the sixteenth protrusion P16 of the first connection region PR1 and the second connection region PR2) from among the first through sixteenth protrusions P1 through P16 included in the first connection region PR1 and the second connection region PR2, which is separated from a first word line cut region (for example, WLC1 in FIG. 4A), and which is arranged higher (from the substrate 101) than other protrusions which are arranged along the second direction (Y). In other words, the first through sixteenth protrusions P1 through P16 of the second connection region PR2 are not all stepped with respect to each other in the second direction (Y) so that heights of the steps sequentially increases along the second direction (Y). Also, the first through sixteenth protrusions P1 through P16 of the first connection region PR1 are not all stepped with respect to each other in the second direction (Y) so that heights of the steps sequentially decreases along the second direction (Y). For example, as compared to FIG. 4C, the position of the sixteenth protrusion P16 in FIG. 5 is switched with the position of the fifteenth protrusion P15. In the embodiment of FIG. 5, the protrusions P13, P14, P16 and P15 arranged sequentially in the second direction (Y) are disposed stepped with respect to each other, whereby protrusion P13 is disposed at a layer relatively lower than (i.e., below) protrusion P14, protrusion P14 is disposed at a layer relatively lower than protrusion P16, and protrusion P16 is disposed at a layer relatively higher than (i.e., above) protrusion P15.

Referring to FIG. 6, the gate line structure GS1b included in the vertical memory device 100a according to an example embodiment, as compared with the first gate line structure GS1 in FIG. 4A and the gate line structure GS1a of FIG. 5, includes the first through sixteenth protrusions P1 through P16 of the first connection region PR1 which are asymmetrically arranged with respect to the first through sixteenth protrusions P1 through P16 of the second connection region PR2. For example, in FIG. 6, the protrusions P13, P14, P15 and P16 in the second connection region PR2 are arranged sequentially from the first word line cut region WLC1 along the second direction (Y), while in the first connection region PR1 the protrusions P15, P16, P14 and P13 are arranged sequentially from the first word line cut region WLC1 along the second direction.

The vertical memory device 100a according to the inventive concepts may include at least one of the first gate line structure GS1 of FIG. 4C, the gate line structure GS1a of FIG. 5, and the gate line structure GS1b of FIG. 6. In addition, a gate line structure included in the vertical memory device 100a according to the inventive concepts is not limited to the first gate line structure GS1 of FIG. 4C, the gate line structure GS1a of FIG. 5, and the gate line structure GS1b of FIG. 6. In other embodiments, the plurality of protrusions may have various different arrangements.

The vertical memory device 100a according to an embodiment of the inventive concepts may include the first through sixteenth protrusions P1 through P16 at each end of the cell region CR, and the plurality of pass transistors TR_P on both sides of the vertical memory device 100a adjacent to each of the first connection region PR1 and the second connection region PR2. Accordingly, it may be easy to form a conductive line for connecting the plurality of pass transistors TR_P to the first through sixteenth gate lines 116_1 through 116_16.

Figure 7A:
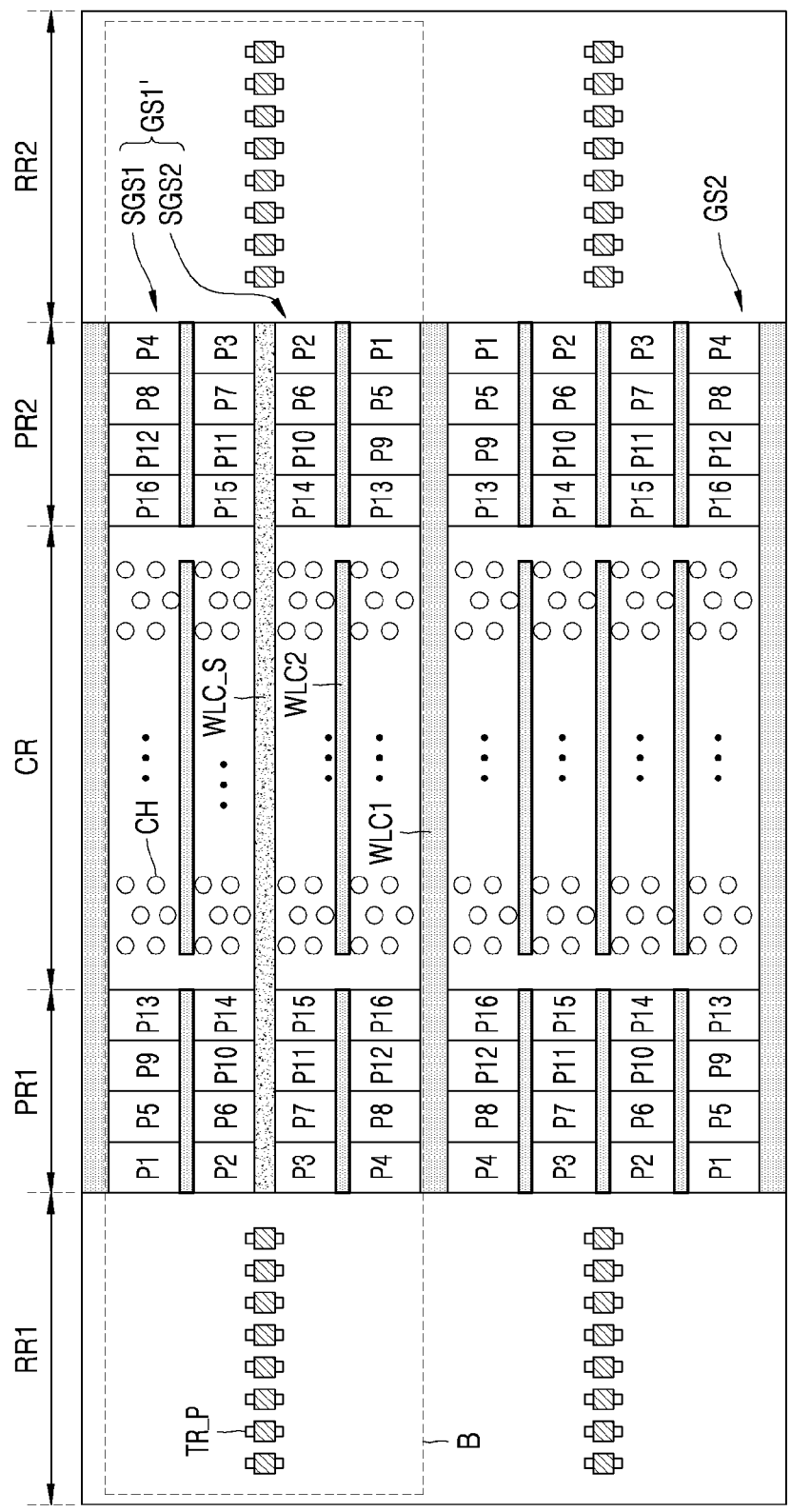
FIG. 7A illustrates a top view of a vertical memory device according to another embodiment of the inventive concepts.
Figure 7B:
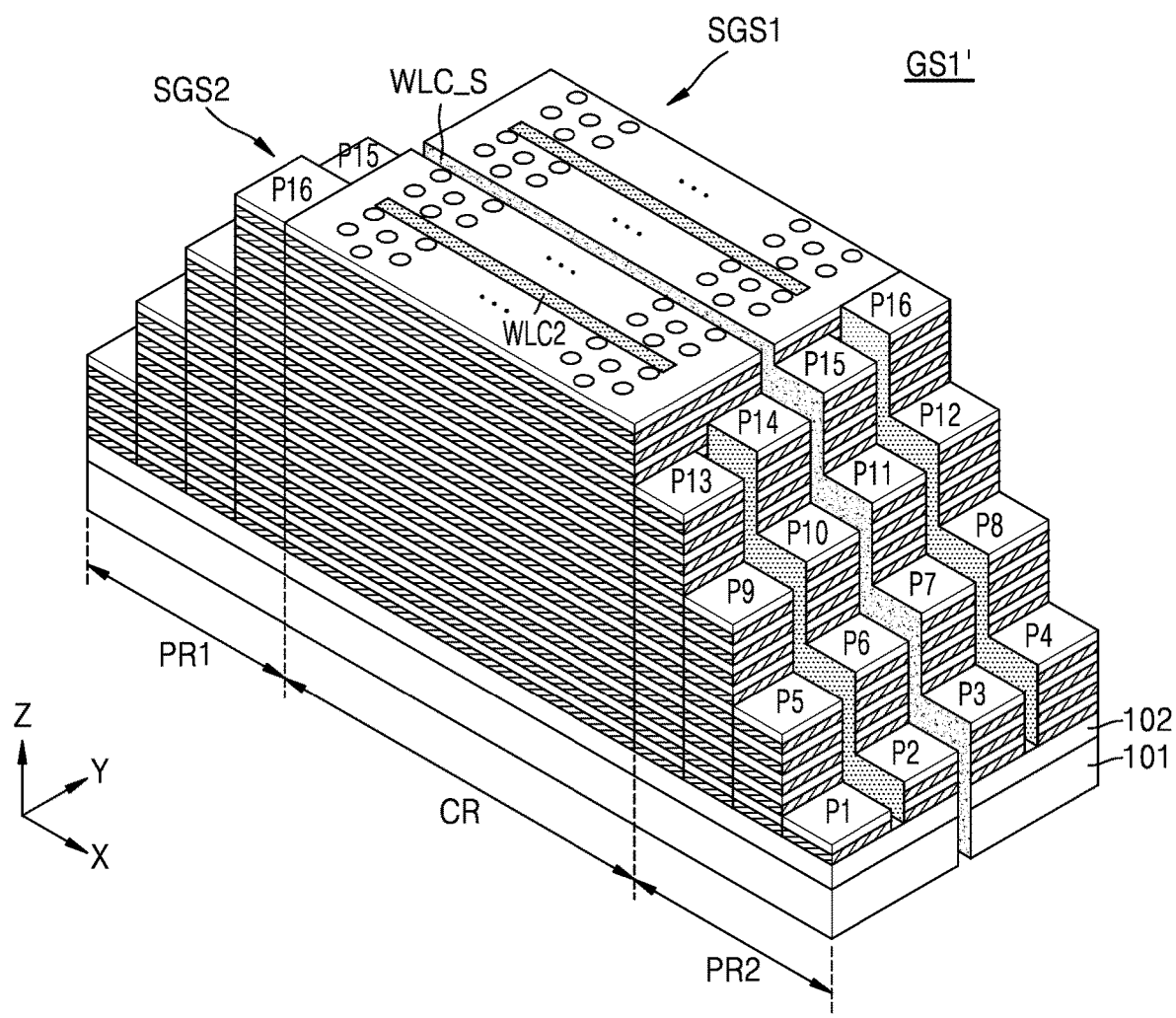
FIG. 7B illustrates a perspective view of a first gate line structure in FIG. 7A.

FIG. 7A illustrates a top view of a vertical memory device 100b according to an embodiment of the inventive concepts. FIG. 7B illustrates a perspective view of a first gate line structure GS1' illustrated in FIG. 7A. Description of the same reference numerals in FIGS. 7A and 7B as those in FIGS. 4A through 4C may be omitted from the following.

Referring to FIGS. 7A and 7B, the vertical memory device 100b includes the first gate line structure GS1' and a second gate line structure GS2. Each of the first gate line structure GS1' and the second gate line structure GS2 includes the first through sixteenth gate lines 116_1 through 116_16 which are sequentially stacked from the top surface of the substrate 101 in the third direction (Z).

The first gate line structure GS1' and the second gate line structure GS2 include the memory cell region CR in which the vertical channel structures CH are formed. The first gate line structure GS1' and the second gate line structure GS2 include the first connection region PR1 and the second connection region PR2 which are respectively arranged at both ends (e.g., first and second ends) of the memory cell region CR. The memory cell region CR is located in a center position between the first and second connection regions PR1 and PR2 along the first direction (X). The first through sixteenth protrusions P1 through P16 of the first gate line structure GS1' and the second gate line structure GS2 for providing the pad structures are arranged in the first connection region PR1 and the second connection region PR2.

The vertical memory device 100b includes the first row decoder region RR1 and the second row decoder region RR2. The first row decoder region RR1 is arranged adjacent to the first connection region PR1 in a direction opposite to the first direction (X), and the second row decoder region RR2 is arranged adjacent to the second connection region PR2 in the first direction (X). The plurality of pass transistors TR_P are formed in the first row decoder region RR1 and the second row decoder region RR2.

The vertical memory device 100b includes the plurality of word line cut regions including the first word line cut region WLC1 and the second word line cut region WLC2. Description of the first word line cut region WLC1 in FIG. 4A may be applied to the first word line cut region WLC1 in FIGS. 7A and 7B, and description of the second word line cut region WLC2 in FIG. 4A may be applied to the second word line cut region WLC2 in FIGS. 7A and 7B.

The vertical memory device 100b includes a sub-word line cut region WLC_S. The sub-word line cut region WLC_S may be formed inside the first gate line structure GS1'. For example, the sub-word line cut region WLC_S may be formed to pass through the center of the width of the first gate line structure GS1' in the second direction (Y) and to extend in a direction parallel to the first direction (X).

The first gate line structure GS1' is thus divided into the first sub-gate line structure SGS1 and the second sub-gate line structure SGS2 by the sub-word line cut region WLC_S. The first word line cut region WLC1 and the sub-word line cut region WLC_S may limit the widths of the first sub-gate line structure SGS1 and the second sub-gate line structure SGS2 in the second direction (Y).

Each of the first sub-gate line structure SGS1 and the second sub-gate line structure SGS2 may correspond to one sub-cell block. For example, the first sub-gate line structure SGS1 may constitute a first sub-cell block, and the second sub-gate line structure SGS2 may constitute a second sub-cell block. The first sub-cell block and the second sub-cell block may operate as different cell blocks, and thus, the control logic (150 in FIG. 1) may control the row decoder (120 in FIG. 1) to respectively control the first sub-cell block and the second sub-cell block. The first sub-cell block and the second sub-cell block, compared with the second cell block formed by the second gate line structure GS2, may have less width in the second direction (Y) and less number of the memory cells included therein.

A connection relationship between the first sub-gate line structure SGS1, the second sub-gate line structure SGS2, and the pass transistors TR_P will be subsequently described with reference to FIG. 8.

The first through sixteenth protrusions P1 through P16 of the first connection region PR1 have stepped shape (i.e., arrangement) in the first direction (X) and the second direction (Y), similar to the arrangement as described with respect to FIGS. 4A-4C. In addition, the first through sixteenth protrusions P1 through P16 of the second connection region PR2 have stepped shape (i.e., arrangement) in the first direction (X) and the second direction (Y), also similar to the arrangement as described with respect to FIGS. 4A-4C. In other words, the protrusions P1 through P16 are arranged as steps in the first direction (X) and in the second direction (Y) perpendicular to the first direction (X). The first sub-gate line structure SGS1 includes the first through sixteenth protrusions P1 through P16 arranged in one connection region of each of the first connection region PR1 and the second connection region PR2, and the second sub-gate line structure SGS2 includes the first through sixteenth protrusions P1 through P16 arranged in one connection region of each of the first connection region PR1 and the second connection region PR2.

Similarly as described with respect to FIGS. 4A-4C, the protrusions arranged on the same layer, among the plurality of protrusions P1 through P16, are arranged diagonally with respect to each other with reference to the first direction (X). The first protrusions P1 of the first and second connection regions PR1 and PR2 within the first gate line structure GS1 are thus positioned diagonally from each other with respect to the first direction (X) (e.g., a center line along the sub-word line cut region WLC_S of the memory cell region (i.e., cell region) which is parallel to the first direction (X)). The protrusions arranged on the same layer are not arranged in parallel with each other in the first direction (X), or in other words are not co-linear with each other in the first direction (X), but are misaligned relative to each other in the second direction (Y). In other words, the first protrusion P1 of the first connection region PR1 for example is formed or arranged to be parallel in the first direction (X) with a protrusion (or protrusions) in the second connection PR2 that is (are) formed on (different) layer(s) from among layers L1 through L16 other than the first layer L1. For example, the first protrusion P1 of the first sub-gate line structure SGS1 is arranged in the first connection region PR1, and the first protrusion P1 of the second sub-gate line structure SGS2 is arranged in the second connection region PR2.

In an embodiment of the inventive concepts, the protrusions arranged on the same layer, among the first through sixteenth protrusions P1 through P16 included in each of the first through sixteenth gate lines 116_1 through 116_16, may be arranged in directions opposite to each other with reference to a center line (e.g., a center line along the sub-word line cut region WLC_S) which is parallel to the first direction (X), and passes through a center of a width of the first gate line structure GS1' in the second direction (Y). Accordingly, even though the sub word line cut region WLC_S is formed at the center of the first gate line structure GS1', and the first sub-gate line structure SGS1 and the second sub-gate line structure SGS2 are separated from each other, each of the first sub-gate structure SGS1 and the second sub-gate line structure SGS2 may include at least one of first through sixteenth protrusions P1 through P16.

Similarly as described with respect to FIGS. 4A-4C, in an embodiment of the inventive concepts, the first through sixteenth protrusions P1 through P16 of the first connection region PR1 are arranged along the second direction (Y) to be at sequentially lower respective layers, and the first through sixteenth protrusions P1 through P16 of the second connection region PR2 are arranged along the second direction (Y) to be at sequentially higher respective layers. For example, one of the protrusions from among the first through sixteenth protrusions P1 through P16 included in the first connection region PR1 and which is in contact with the first word line cut region WLC1 may be arranged to be higher (e.g., from the substrate 101) than other protrusions sequentially arranged in the second direction (Y). Also, one of the protrusions from among the first through sixteenth protrusions P1 through P16 included in the second connection region PR2 and which is in contact with the first word line cut region WLC1 may be arranged to be lower than other protrusions sequentially arranged in the second direction (Y). However, the vertical memory device 100b according to the inventive concepts are not limited thereto, and in other embodiments as illustrated in FIGS. 5 and 6, among the first through sixteenth protrusions P1 through P16 included in the first connection region PR1 and the second connection region PR2, at least one protrusion spaced from the first word line cut region WLC1 may be arranged higher from the substrate 101 than the other protrusions arranged along the second direction (Y).

In FIG. 7A, the vertical memory device 100b is illustrated to include the first gate line structure GS1' including the first sub-gate line structure SGS1 and the second sub-gate line structure SGS2, and the second gate line structure GS2 which is not divided into sub-gate line structures. However, the inventive concepts are not limited thereto, and in other embodiments the vertical memory device 100b may include at least one gate line structure which is divided into the plurality of sub-gate line structures.

The vertical memory device 100b according to embodiments of the inventive concepts includes the gate line structure that is divided into the plurality of sub-gate line structures, so that the vertical memory device 100b may include a sub-cell block (for example, the first sub-cell block and the second sub-cell block respectively corresponding to the first sub-date line structure SGS1 and the second sub-gate line structure SGS2) having relatively smaller capacity than a general cell block (for example, the second cell block corresponding to the second gate line structure SGS2). In these corresponding embodiments, the vertical memory device 100b may use a sub-cell block instead of a general cell block when only some memory cells of the general cell block are sufficient. Accordingly, wasteful use of a total portion of the general cell block may be reduced. Thus, a size of a semiconductor chip in which the vertical memory device 100b is implemented may be reduced.

Figure 8:
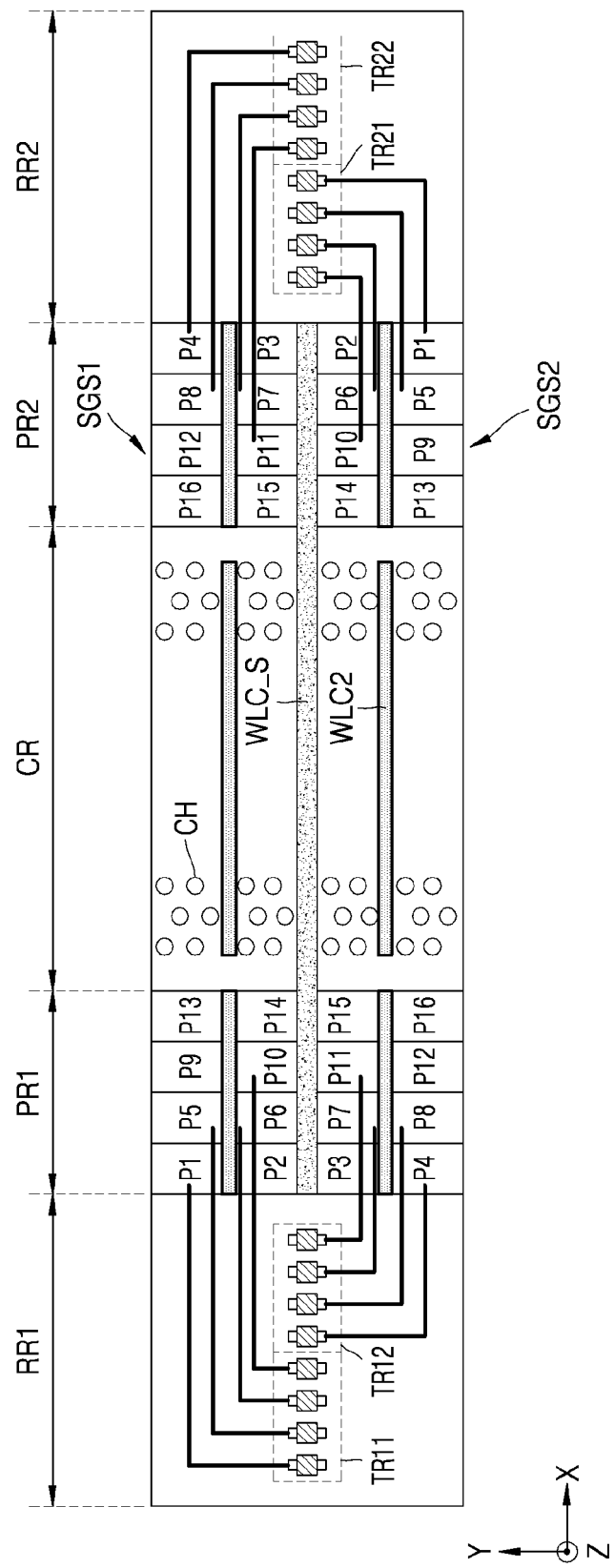
FIG. 8 illustrates an enlarged top view of a portion B of a vertical memory device in FIG. 7A.

FIG. 8 illustrates an enlarged top view of a portion B of the vertical memory device 100b according to the embodiment in FIG. 7A. FIG. 8 is a diagram for explaining a connection relationship between the first through sixteenth protrusions P1 through P16 and the pass transistors TR_P. Description of the same reference numerals in FIG. 8 as those in FIGS. 7A and 7B may be omitted from the following.

Referring to FIG. 8, first pass transistors TR11 electrically connected to the first sub-gate line structure SGS1 and second pass transistors TR12 electrically connected to the second sub-gate line structure SGS2 are formed in the first row decoder region RR1. First pass transistors TR21 electrically connected to the second sub-gate line structure SGS2 and second pass transistors TR22 electrically connected to the first sub-gate line structure SGS1 are formed in the second row decoder region RR2.

At least one pass transistor of the first and second pass transistors TR11 and TR12 of the first row decoder region RR1, and the first and second pass transistors TR21 and TR21 of the second row decoder region RR2 may be electrically connected to a plurality of different protrusions.

For example, the first protrusion P1 and the second protrusion P2 of the first connection region PR1 may be electrically connected to each other, and may thus be electrically connected to a same one pass transistor TR_P. The third protrusion P3 and the fourth protrusion P4 of the second connection region PR2 may be electrically connected to each other, and thus may be electrically connected to a same one pass transistor TR_P. In addition, the ninth protrusion P9, the tenth protrusion P10, the thirteenth protrusion P13, and the fourteenth protrusion P14 of the first connection region PR1 may be electrically connected to each other, and thus may be electrically connected to a same one pass transistor TR_P. The eleventh protrusion P11, the twelfth protrusion P12, the fifteenth protrusion P15, and the sixteenth protrusion P16 of the second connection region PR2 may be electrically connected to each other, and thus may be electrically connected to a same one pass transistor TR_P. Thus, each of the fifth protrusion P5, the sixth protrusion P6, the seventh protrusion P7, and the eighth protrusion P8 may be connected to respective different corresponding pass transistors in the first sub-gate line structure SGS1.

The description of the first through sixteenth protrusions P1 through P16 of the first sub-gate line structure SGS1 may also be applied to the first through sixteenth protrusions P1 through P16 of the second sub-gate line structure SGS2.

In the vertical memory device 100b according to the inventive concepts, the first sub-gate line structure SGS1 may correspond to the first sub-cell block, and the second sub-gate line structure SGS2 may correspond to a second sub-cell block. When only some memory cells of the first sub-cell block and the second sub-cell block are used, the gate lines and the pass transistors may be connected to each other in a one-to-one manner such that the row line voltage (for example, a word line voltage) applied to the gate lines in which only the used some memory cells are formed (for example, 116_5, 116_6, 116_7, and 116_8 in FIG. 7B) are respectively controlled. On the other hand, the gate lines of the layers on which unused memory cells are formed may be electrically connected to each other, and one pass transistor TR_P may switch the row line voltages applied to the plurality of gate lines connected to each other (for example, the word line voltage, a ground selection line voltage, or a string selection line voltage).

The vertical memory device 100b may include less number of the pass transistors TR_P than a number corresponding to the number of the plurality of gate lines included in the first sub-gate line structure SGS1 and the number of the plurality of gate lines included in the second sub-gate line structure SGS2. Thus, the vertical memory device 100b according to the inventive concepts may include a reduced number of pass transistors TR_P and may simultaneously control operation of the unused memory cells.

Figure 9:
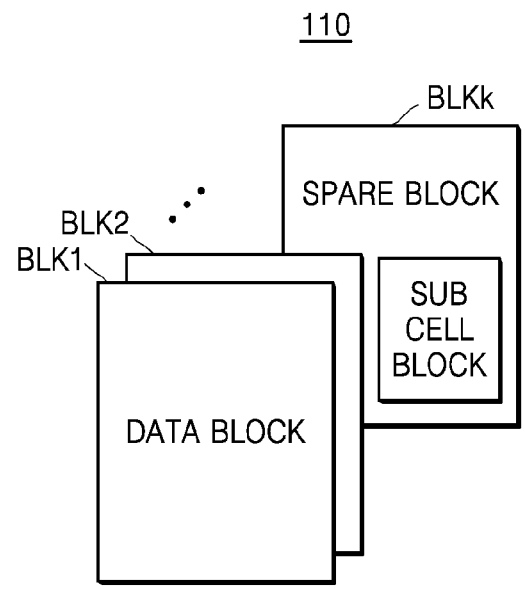
FIG. 9 illustrates a block diagram of a memory cell array included in a vertical memory device according to an embodiment of the inventive concepts.

FIG. 9 illustrates a block diagram of the memory cell array 110 included in the vertical memory device 100b according to an embodiment of the inventive concepts.

Referring to FIG. 9, the memory cell array 110 includes first through $n^{th}$ cell blocks BLK1, BLK2 through BLKn. The cell block 111 in FIG. 2 may be one of the first through $n^{th}$ cell blocks BLK1 through BLKn.

The first through $k^{th}$ cell blocks BLK1 through BLKk may include first through $(k-1)^{th}$ data blocks BLK1 to BLKk-1 for storing data and at least one spare block BLKk. Here, k may be a natural number of 3 or more. In an embodiment, the spare block BLKk may be a cell block for replacing a bad block when the bad block is generated among the first through $(k-1)^{th}$ data blocks BLK1 through BLKk-1. In an embodiment, the spare block BLKk may be used to store data that is recovered after an error correction code (ECC) decoding process has failed in the first through $(k-1)^{th}$ data blocks BLK1 through BLKk-1.

Since a usage purpose of the spare block BLKk is different from that of the first through (k-1)th data blocks BLK1 through BLKk-1, it may be important to variously utilize the cell blocks by increasing the number of cell blocks rather than by increasing a storage capacity of the cell blocks. Thus, the spare block BLKk may be implemented to include the first sub-cell block and the second sub-cell block, such as the first cell block implemented with the first gate line structure GS1' in FIG. 7A. A size of a total semiconductor chip in which the vertical memory device 100b is implemented may be reduced when the spare block BLKk includes a plurality of sub-cell blocks.

The vertical memory device 100b according to the inventive concept is not limited to only the spare block BLKk including the plurality of sub-cell blocks, and in other embodiments at least one data block among the first through $(k-1)^{th}$ data blocks BLK1 through BLKk-1 may include the plurality of sub-cell blocks.

Figure 10:
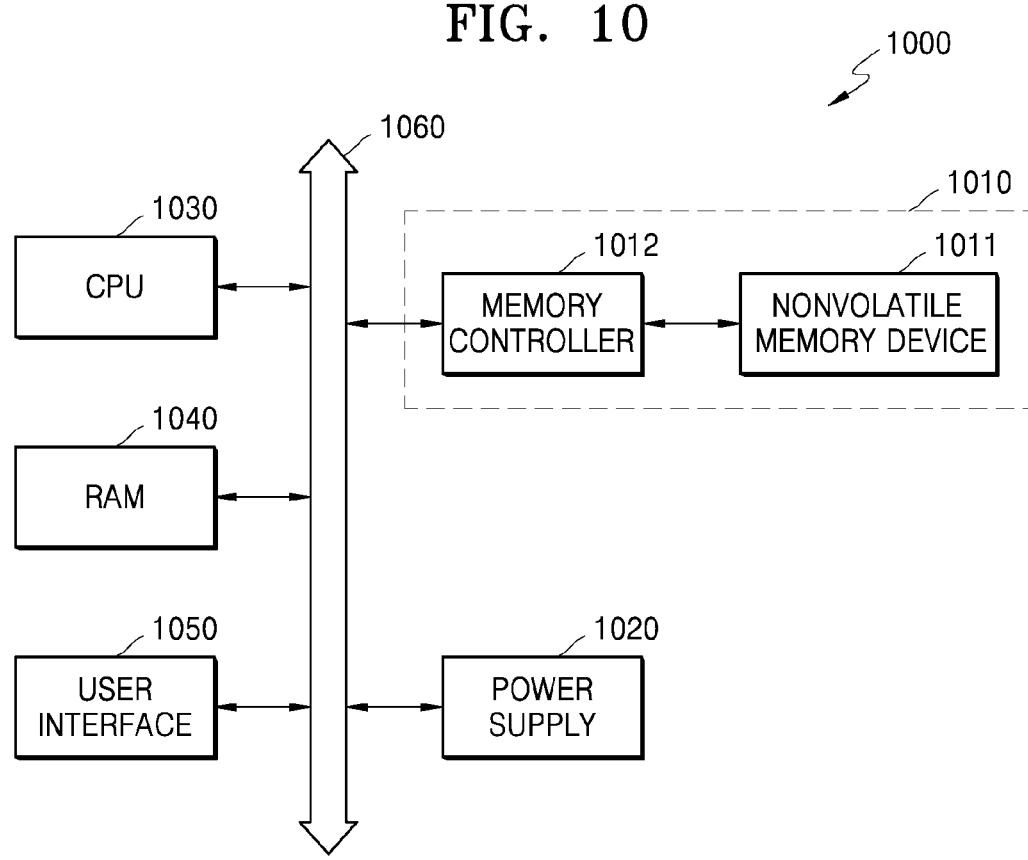
FIG. 10 illustrates a diagram of a computing system including a vertical memory device according to an embodiment of the inventive concepts.

FIG. 10 illustrates a diagram of a computing system device 1000 including a vertical memory device according to an embodiment of the inventive concepts.

Referring to FIG. 10, the computing system device 1000 includes a central processing unit (CPU) 1030 electrically connected to a bus 1060, a user interface 1050, and a nonvolatile memory device 1010 including a memory controller 1012 and a nonvolatile memory device 1011.

The nonvolatile memory device 1011 may include the vertical memory device 100 illustrated in FIG. 1, the vertical memory device 100a illustrated in FIG. 4A, or the vertical memory device 100b illustrated in FIG. 7A. Accordingly, the size of the memory chip in which the nonvolatile memory device 1011 is implemented may be reduced and a manufacturing process thereof may be facilitated.

The computing system device 1000 may further include a RAM 1040 and a power supplier 1020.

When the computing system device 1000 is a mobile device, a battery for supplying an operating voltage thereof and a modem such as a baseband chipset may be additionally provided. In addition, it should be understood by those of ordinary skill in the art that the computing system device 1000 may further include for example an application chipset, a camera image processor (CIS), a mobile dynamic RAM (DRAM), among various other components, and thus, a detailed description thereof is omitted.

The memory controller 1012 and the nonvolatile memory device 1011 may constitute, for example, a solid state drive/disk (SSD) using a nonvolatile memory for storing data.

While the inventive concepts have been particularly shown and described with reference to example embodiments thereof, the inventive concepts are not limited to the example embodiments, and various changes and modifications may be made by those of ordinary skill in the art without departing from the spirit and scope of the inventive concepts.

What is claimed is:

1. A vertical memory device comprising:
   a gate line structure comprising a first gate line and a second gate line which are sequentially stacked on a substrate and extend in a first direction parallel to a top surface of the substrate; and
   a vertical channel structure configured to penetrate the gate line structure in a direction perpendicular to the top surface of the substrate,
   wherein the gate line structure comprises a cell region in which the vertical channel structure is formed, and a first connection region and a second connection region which are respectively arranged at first and second ends of the cell region along the first direction,
   each of the first connection region and the second connection region comprises a first protrusion of the first gate line and a second protrusion of the second gate line which are parallel to the top surface of the substrate and arranged as steps in a second direction perpendicular to the first direction, and
   the first protrusion of the second connection region is arranged diagonally from the first protrusion of the first connection region with respect to the first direction.

2. The vertical memory device of claim 1, wherein the first protrusion and the second protrusion of the first connection region are symmetrically arranged with respect to the first protrusion and the second protrusion of the second connection region with reference to a center point of the cell region.

3. The vertical memory device of claim 1, wherein the first protrusion and the second protrusion of the first connection region are asymmetrically arranged with respect to the first protrusion and the second protrusion of the second connection region.

4. The vertical memory device of claim 1, wherein the gate line structure further comprises a third gate line stacked on the second gate line and extending in the first direction parallel to the top surface of the substrate, wherein each of the first connection region and the second connection region comprises a third protrusion of the third gate line arranged as steps with the first protrusion and the second protrusion in the second direction, and the third protrusion of the second connection region is arranged diagonally from the third protrusion of the first connection region with respect to a center line of the cell region.

5. The vertical memory device of claim 4, wherein, in the first connection region, the first protrusion, the second protrusion, and the third protrusion are sequentially arranged in the second direction.

6. The vertical memory device of claim 4, wherein, in the first connection region, the first protrusion, the third protrusion, and the second protrusion are sequentially arranged in the second direction.

7. The vertical memory device of claim 1, further comprising a word line cut region extending along a center line of the cell region, wherein the gate line structure comprises a first sub-gate line structure and a second sub-gate line structure which are separated by the word line cut region.

8. A vertical memory device comprising:
   a gate line structure comprising a plurality of gate lines which are sequentially stacked on a substrate and extend parallel to a top surface of the substrate in a first direction; and
   a vertical channel structure configured to penetrate the gate line structure in a direction perpendicular to the top surface of the substrate,
   wherein the gate line structure comprises a cell region in which the vertical channel structure is formed, and a first connection region and a second connection region which are respectively arranged at first and second ends of the cell region along the first direction,
   each of the first connection region and the second connection region comprises a plurality of protrusions of the plurality of gate lines arranged as steps in the first direction and in a second direction perpendicular to the first direction, and
   each of the plurality of protrusions of the first connection region is arranged in parallel along the first direction with protrusions from among the plurality of protrusions of the second connection region on different layers of the plurality of gate lines,
   wherein the plurality of protrusions in the first connection region are arranged as steps of decreasing height in the second direction, and the plurality of protrusions in the second connection region are arranged as steps of increasing height in the second direction.

9. The vertical memory device of claim 8, wherein the plurality of protrusions of the first connection region are symmetrically arranged with the plurality of protrusions of the second connection region with reference to a center point of the cell region.

10. The vertical memory device of claim 8, wherein protrusions from among the plurality of protrusions on a same layer of the plurality of gate lines comprise a first protrusion in the first connection region and a second protrusion in the second connection region, wherein the first protrusion and the second protrusion are arranged in directions opposite to each other with respect to a center line which is parallel to the first direction and passes through a center of a width of the gate line structure in the second direction.

11. The vertical memory device of claim 10, further comprising a word line cut region extending along the center line, wherein the gate line structure comprises a first sub-gate line structure and a second sub-gate line structure which are separated by the word line cut region.

12. A vertical memory device comprising:
   a gate line structure comprising a plurality of gate lines which are sequentially stacked on a substrate and extend in a first direction parallel to a top surface of the substrate;
   a vertical channel structure configured to penetrate the gate line structure in a direction perpendicular to the top surface of the substrate; and
   a plurality of pass transistors electrically connected to the plurality of gate lines,
   wherein the gate line structure comprises a cell region in which the vertical channel structure is formed, and a first connection region and a second connection region which are respectively arranged at first and second ends of the cell region in the first direction,
   each of the first connection region and the second connection region comprises a plurality of protrusions of the plurality of gate lines arranged as steps in the first direction and in a second direction perpendicular to the first direction, and
   protrusions from among the plurality of protrusions on a same layer of the plurality of gate lines are arranged to be misaligned relative to each other in the second direction.

13. The vertical memory device of claim 12, wherein each of the plurality of gate lines is connected to one pass transistor from among the plurality of pass transistors via at least one protrusion from among the plurality of protrusions on a same layer of the plurality of gate lines.

14. The vertical memory device of claim 12, further comprising a word line cut region configured to pass through a center of a width of the gate line structure in the second direction, and configured to extend along a center line parallel to the first direction, wherein the gate line structure comprises a first sub-gate line structure and a second sub-gate line structure which are separated by the word line cut region.

15. The vertical memory device of claim 14, wherein some protrusions from among the plurality of protrusions on different layers of the plurality of gate lines in the first sub-gate line structure are electrically connected to each other, and the some protrusions are electrically connected to one pass transistor from among the plurality of pass transistors.

16. The vertical memory device of claim 14, wherein the plurality of pass transistors comprise a plurality of first pass transistors connected to protrusions from among the plurality of protrusions in the first sub-gate line structure, and a plurality of second pass transistors connected to protrusions from among the plurality of protrusions in the second sub-gate line structure.

17. The vertical memory device of claim 16, wherein some of the plurality of first pass transistors are arranged in a first row decoder region adjacent to the first connection region, and others of the plurality of first pass transistors are arranged in a second row decoder region adjacent to the second connection region, and
wherein some of the plurality of second pass transistors are arranged in a first row decoder region, and others of the plurality of second pass transistors are arranged in the second row decoder region.

18. The vertical memory device of claim 12, wherein the plurality of protrusions of the first connection region are arranged symmetrically with the plurality of protrusions of the second connection region with reference to a center point of the cell region.

19. The vertical memory device of claim 1, wherein the first protrusion of the first connection region and the first protrusion of the second connection region are arranged in opposite regions with respect to a center line of the cell region which is parallel to the first direction.

* * * * *